(12) United States Patent
Sudo et al.

(10) Patent No.: US 6,937,515 B2
(45) Date of Patent: Aug. 30, 2005

(54) SEMICONDUCTOR MEMORY DEVICE

(75) Inventors: Naoaki Sudo, Kanagawa (JP); Hiroshi Sugawara, Kanagawa (JP); Naoichi Kawaguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/652,229

(22) Filed: Aug. 29, 2003

(65) Prior Publication Data

US 2004/0052124 A1 Mar. 18, 2004

(30) Foreign Application Priority Data

Aug. 30, 2002 (JP) .......................................... 2002-253398

(51) Int. Cl.[7] .............................................. G11C 16/04
(52) U.S. Cl. ............................ 365/185.12; 365/185.21; 365/185.23
(58) Field of Search ........................ 365/185.12, 185.21, 365/185.23, 230.08, 189.05, 238.5

(56) References Cited

U.S. PATENT DOCUMENTS 6,496,415 B2 * 12/2002 Tsao ....................... 365/185.12

* cited by examiner

*Primary Examiner*—David Lam
(74) *Attorney, Agent, or Firm*—Darryl G. Walker; Bradley T. Sako

(57) ABSTRACT

A semiconductor memory device has a reduced number of sense amplifiers to suppress an increase in chip size and power consumption as integration is increased. A semiconductor memory device can be adapted to read out from a memory cell array in pages or bursts can include sense amplifiers (2) for reading out data for a page length or burst length in two parts, including a first half and second half, and a page buffer (3) for storing data for the page length or burst length read out from a memory cell array (1) by the sense amplifier (2).

18 Claims, 9 Drawing Sheets

SEMICONDUCTOR MEMORY DEVICE

TECHNICAL FIELD

The present invention relates to generally to a semiconductor memory device, and more particularly to a semiconductor memory device in which data is read out in pages or bursts.

BACKGROUND OF THE INVENTION

Among the types of semiconductor memory devices that read data out in pages and/or bursts are flash memories. A flash memory is a kind of read-only-memory (ROM) that is often referred to as a flash electrically erasable programmable ROM (EEPROM). A flash EEPROM is a nonvolatile semiconductor device, the contents of which can be electrically erased or written. A conventional configuration for this type of semiconductor memory device will be described below with reference to FIG. 11.

FIG. 11 is a block diagram showing the configuration of a conventional semiconductor memory device. Note that FIG. 11 illustrates a configuration for reading out data. To avoid unduly cluttering the view, sections utilized in writing data, and a mode control circuit for placing the semiconductor memory device in various operating modes, and the like, are omitted.

As shown in FIG. 11, a conventional semiconductor memory device is configured to include a memory cell array 101 composed of a number of memory cells in which data is stored, a sense amplifier 102 for reading out data stored in memory cell array 101, a page buffer 103 for temporarily holding the data read out from the memory cell array 101, an output buffer 104 for outputting the read-out data to the outside of the device, a number of input buffers 105 for receiving an address signal from outside the device, and a number of address generating circuits 106 that each generate a control signal according to which data is to be output from the page buffer 103 based on the mode. Such a mode can be a page mode or burst mode.

In the conventional semiconductor memory device of FIG. 11, the number of sense amplifiers 102 provided agrees with a given page length or burst length to enable a collective read-out of data for the memory cell array 101 corresponding to such lengths. Data read out from a memory cell array 101 is held in the page buffer 103. Such data is then output at a page length or burst length synchronously with control signals IA0 to IA2 generated in address generating circuit 106.

It is noted that the conventional semiconductor memory device shown in FIG. 11 is configured to read out, for example, the data of two words in units of eight data at a maximum (the page length and the burst length equals eight). Thus, in the configuration of FIG. 11, data can be read out from the memory cell region 101 using upper bits of an address signal (e.g., A3 to A22: hereinafter referred to as the "normal" address). Then, the data for the page length or burst length is output in a predetermined order from the page buffer 103 using the lower bits of the address signal (e.g., A0 to A2: hereinafter referred to as the "page" address). It is noted that a circuit for selecting the above-mentioned cell region is omitted in FIG. 11.

A conventional address generating circuit 106 can have a burst address counter 107 and an address selecting circuit 108. The burst address counters 107 are incremented synchronously according to a predetermined clock, and provide internal address signals IA2_B, IA1_B and IA0_B. In the page mode, address selecting circuit 108 outputs internal address signals IA2_A, IA1_A and IA0_A, provided from input buffers 105, as control signals IA2 to IA0, respectively. In the burst mode, address selecting circuit 108 outputs internal address signals IA2_B, IA1_B and IA0_B, provided from burst address counters 107, as control signals IA2 to IA0, respectively.

With such a configuration, page addresses from the outside of the device are provided as control signals IA2 to IA0 in the page mode, and a count result from burst address counters 107 is provided as control signals IA2 to IA0 in the burst mode. The page buffer 103 decodes control signals IA2 to IA0 supplied from address generating circuit 106 to output data DQ of addresses corresponding to a decode result.

In the conventional semiconductor memory device described above, the amount of data collectively read out from the memory cell array to the page buffer is equal to a page length or a burst length. As a result, there is a need to include a number of sense amplifiers corresponding to a maximum page length or maximum burst length. Still further, such a configuration must allow for necessary access combinations that may be required. In particular, while it may be required that data be read from a memory cell array according to a one lower address order (e.g., 000, 001, 010, . . . 111), data may also have to output in some other arbitrary order.

In the above arrangement, the sense amplifier 102 reproduces data stored in the memory cell array according to all bits that are required for a read operation. Thus, in the case where data of two words (32-bits) are read out in units of 8, 256 (8×32) sense amplifiers are required.

In a conventional semiconductor memory device, such as a flash memory, a sense amplifier is provided with a reference cell for judging whether each bit of data read is a "1" or "0". Further, a circuit is also provided for supplying the reference cell with a predetermined current. Still further, in recent semiconductor memory devices, memory cells can store multi-valued data values, instead of only binary data of "1" or "0". In such an arrangement, a reference cell and circuits for supplying current to the reference cell are increased in scale. As a result, circuit size continues to increase as devices are scaled to store more data.

Due to the above, a problem arises in that a large layout area is required for sense amplifiers, resulting in increased chip size. This works against the goal of limiting chip sizes by requiring limited memory cell array sizes. Moreover, as the number of sense amplifiers is increased, the power consumption of the overall semiconductor memory device increases.

In light of the above, it would be desirable to address the above problems present in conventional approaches. In particular, it would be desirable to provide a semiconductor memory device having a reduced number of sense amplifiers to thereby suppress increases in chip size and reduce power consumption. At the same time, it would desirable that such a semiconductor memory device be capable of providing page mode and burst mode read access.

SUMMARY OF THE INVENTION

According to the present invention, a semiconductor memory device can include a plurality of sense amplifiers that read out data from a memory cell array at least twice to access a first portion of the read out data and a second portion of the read out data for a page mode read or burst mode read. The semiconductor memory also includes a page buffer for storing the first portion and second portion of the read out data for subsequent output from the page buffer.

According to one aspect of the embodiments, an amount of data bits of the first portion and second portion combined is a maximum page length accessible by the semiconductor memory device and a maximum burst length accessible by the semiconductor memory device.

According to another aspect of the embodiments, read operations can access data starting at a page base address, where such a page address comprises multiple bits of an address used in selecting data for a page or burst access. A first address generating circuit can be coupled to a most significant bit of a page address, and can generate a first control signal for selecting which of the first portion or second portion is captured in the page buffer. The first address generating circuit can also generate a second control signal for selecting which of the captured first portion or second portion is output from the page buffer. A plurality of second address generating circuits can be coupled to less significant bits of the page address, and can generate third control signals for controlling the timing at which data is output from the page buffer.

According to another aspect of the embodiments, a first address generating circuit can include a page read look-ahead judging circuit that generates a first internal address signal for accessing the first portion or second portion. A first burst address counter, that is incremented according to a first clock of a first predetermined period, can output a most significant bit of a second internal address signal corresponding to the bits of the page address. A first address selecting circuit can select from among an output of the page read look-ahead judging circuit and an output of the first burst address counter to generate a first control signal. Such a selection can be in response to a mode value.

According to another aspect of the embodiments, a first address counter can further include a second burst address counter that is incremented according to a second clock having a different period than the first clock. The second burst address counter can output a least significant bit of a third internal address signal. The third internal address signal can correspond to an ordinary address and most significant page address bit. Further, a first address selecting circuit can select from among the output of the second burst address counter and a fourth address signal corresponding to the most significant bit of the page address to generate a second control signal. Such a selection can be in response to a mode value.

According to another aspect of the embodiments, each second address generating circuit can include a third burst address counter that increments according to the first clock, and outputs a less significant bit of the second internal address. In addition, in a burst mode, a second address selecting circuit can generate a third control signal from the output of the third burst address counter. In a page mode, the second address selecting circuit can generate the third control signal from a less significant bit of the page address in a page mode.

According to another aspect of the embodiments, a page read look-ahead judging circuit changes the logic level of the first internal address signal from a first logic value to a second logic value prior to data from the first portion being output from the semiconductor memory device. In addition, data of the second portion is read out by the sense amplifiers by the time the most significant bit of a page address transitions from a logic "0" to a logic "1".

According to another aspect of the embodiments, a page read look-ahead judging circuit can change the logic level of a first internal address signal in response to the page address bit values transitioning from all being at one logic value to at least one being at another logic value.

The present invention may also include a semiconductor memory device having a sense amplifier set with M sense amplifiers. A memory cell array can couple at least two different portions of the memory cell array to the sense amplifier set in different access operations in response to a first control signal. Further, a page buffer can stores N data bits from the different access operations, where N is greater than M. Such data bits can be output in groups of Q, where Q is less than M and greater than 1.

According to one aspect of the embodiments, a number of sense amplifiers M can be half the number of page buffer data bits N.

According to another aspect of the embodiments, a memory cell array can include nonvolatile memory cells, and can couple at least two different portions of the memory cell array to a sense amplifier set in different access operations in both a page mode and a burst mode.

According to another aspect of the embodiments, a semiconductor memory device can further include a first address generating circuit that includes a page read look-ahead circuit that provides an output signal in response to a most significant bit of a page address to access a first portion of the memory cell array. The page read look-ahead circuit can then alter the first control signal in response to a predetermined change in the page mode address to access a second portion of the memory cell array.

According to another aspect of the embodiments, a first address generating circuit further can include a burst address counter that provides an output value that is incremented in response to a first control signal. A first address selecting circuit that can select from among an output of a page read look-ahead circuit and an output of the burst address counter in response to mode information.

The present invention can also include a semiconductor memory device having a page buffer for storing data values for output in a page mode and burst mode, and a set of sense amplifiers that can read out data values to the page buffer for one page mode access or one burst mode access in at least two different operations. Such different operations can access different portions of a memory cell array.

According to another aspect of the embodiments, a page buffer can include a first output circuit, coupled between a first holding circuit and a data output, that is enabled by an output control signal having a first value. A second output circuit, coupled between a second holding circuit and the data output, can be enabled by the output control signal having a second value.

According to another aspect of the embodiments, a semiconductor memory device can further include a first address generating circuit that generates an output control signal in response to a most significant page address bit value in a page mode, and generates the output control signal in response to a burst address counter in a burst mode.

According to another aspect of the embodiments, a semiconductor memory device can further include a first portion of the data values are stored at lower page addresses and a second portion of the data values are stored at higher page addresses. A page read look-ahead circuit can set an address signal for accessing the first portion of the data values in a first read operation. The page read look-ahead circuit can set the address signal for accessing the second portion of the data values in response to a lower page address in a second read operation.

According to another aspect of the embodiments, a page read look-ahead circuit can set an address signal for accessing the second portion of the data values in response to bits of a page address changing from being the same value to at least one of the bits being different from the other page address bits.

According to another aspect of the embodiments, a set of sense amplifiers can read out a first portion of the data values to a page buffer in a first operation, and can read out a second portion of the data values to the page buffer in a second operation, before the first portion data values are output from the page buffer.

According to another aspect of the embodiments, a semiconductor memory device can further include a first address generating circuit that, in a page mode, can generate an output control signal that accesses different portions of the page buffer in response to a most significant bit of a page address. In a burst mode, the first address generating circuit can access different portions of the page buffer in response to a burst address counter.

A semiconductor memory device configured as described above, can have sense amplifiers for reading data for a page length or burst length by accessing a memory cell array two times: once for a first half of the data, once again for a second half of the data. A page buffer can store the data for the page length or burst length read out by the sense amplifiers. In such an arrangement, the operation of reading out data for page or burst access can be realized with a number of sense amplifiers that is half the page length or burst length.

DETAILED DESCRIPTION OF THE EMBODIMENTS

Various embodiments of the present invention will now be described in detail with reference to accompanying drawings.

Figure 1:
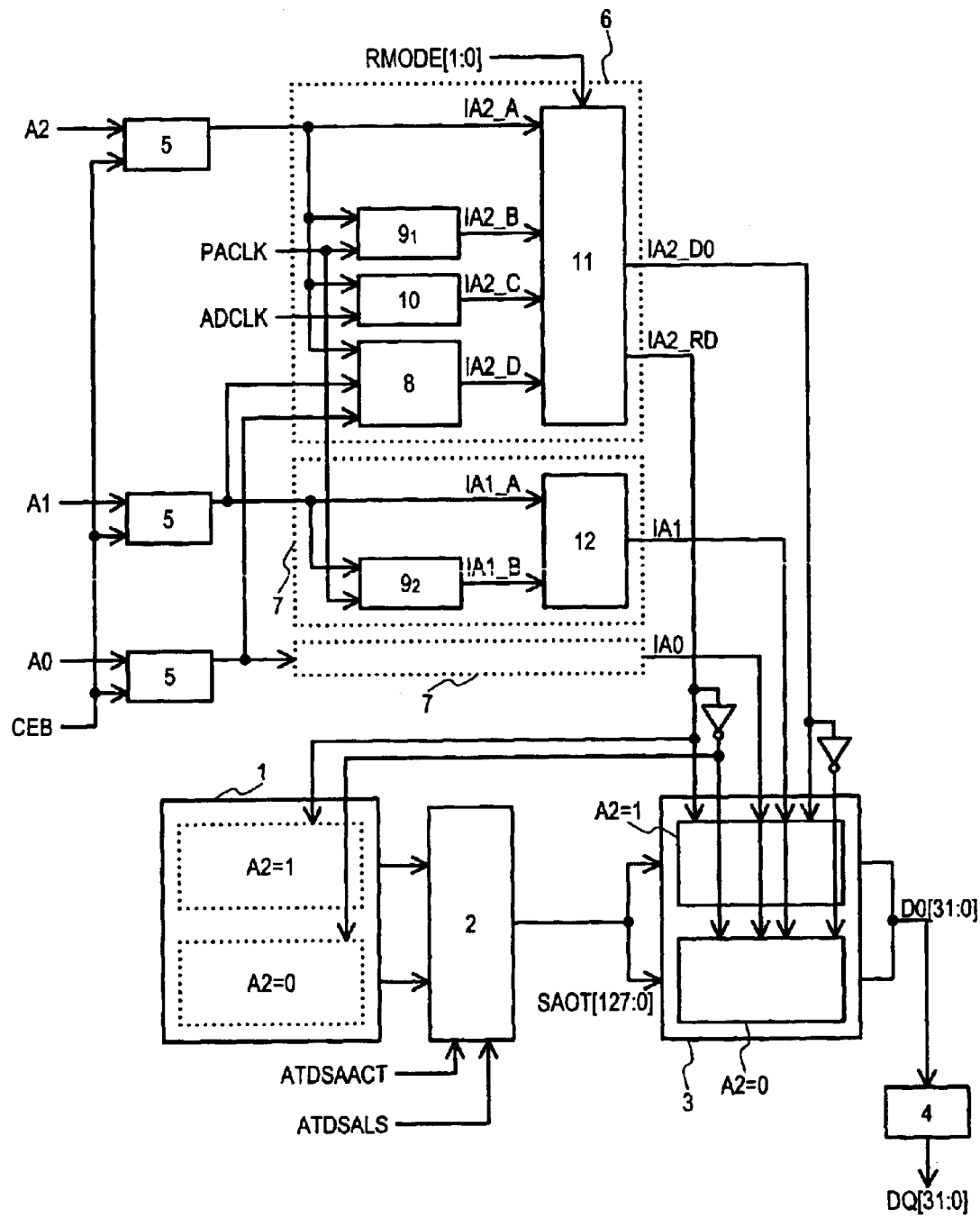
FIG. 1 is a block diagram showing a semiconductor memory device according to one embodiment of the present invention.
Figure 2:
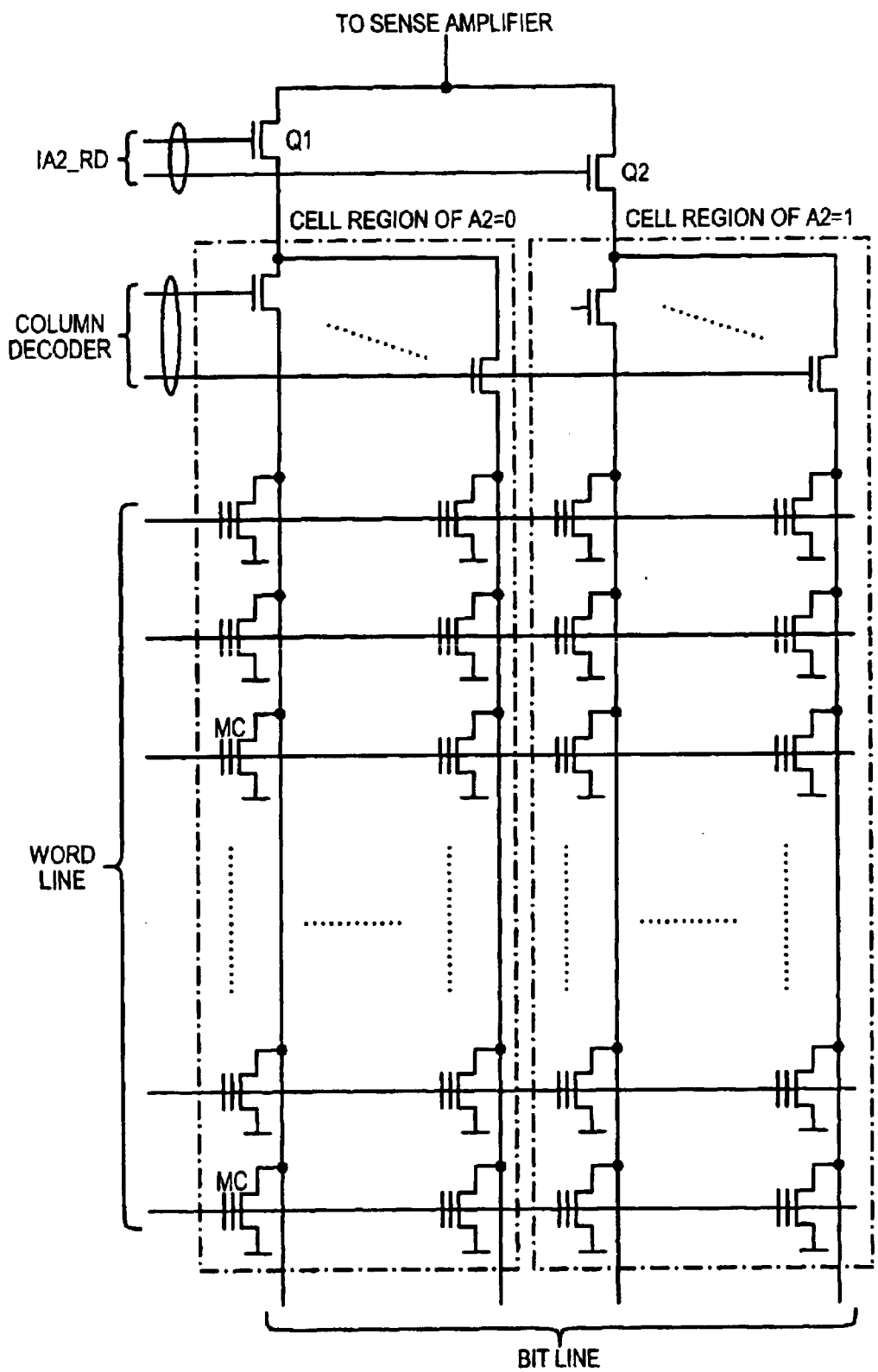
FIG. 2 is a circuit diagram showing a memory cell array that can be included in a semiconductor device like that of FIG. 1.
Figure 3:
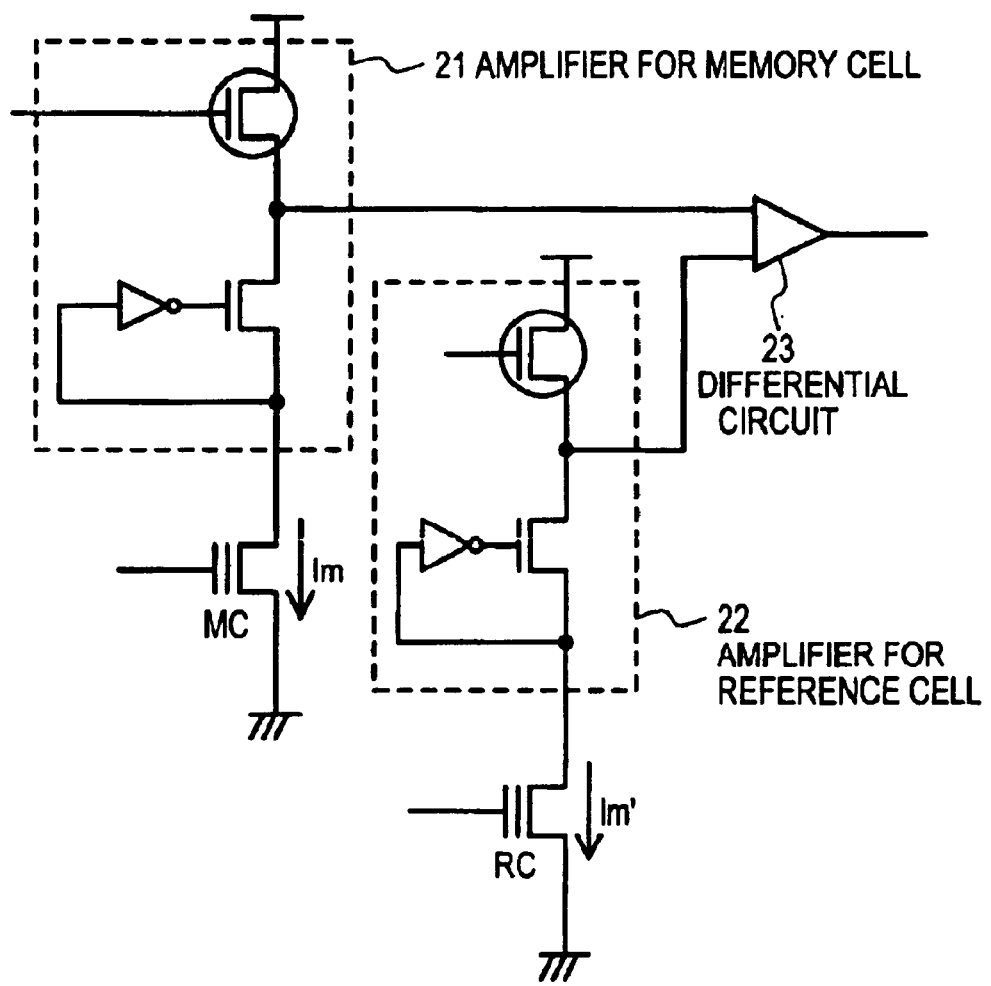
FIG. 3 is a circuit diagram showing a sense amplifier that can be included in a semiconductor device like that of FIG. 1.
Figure 4:
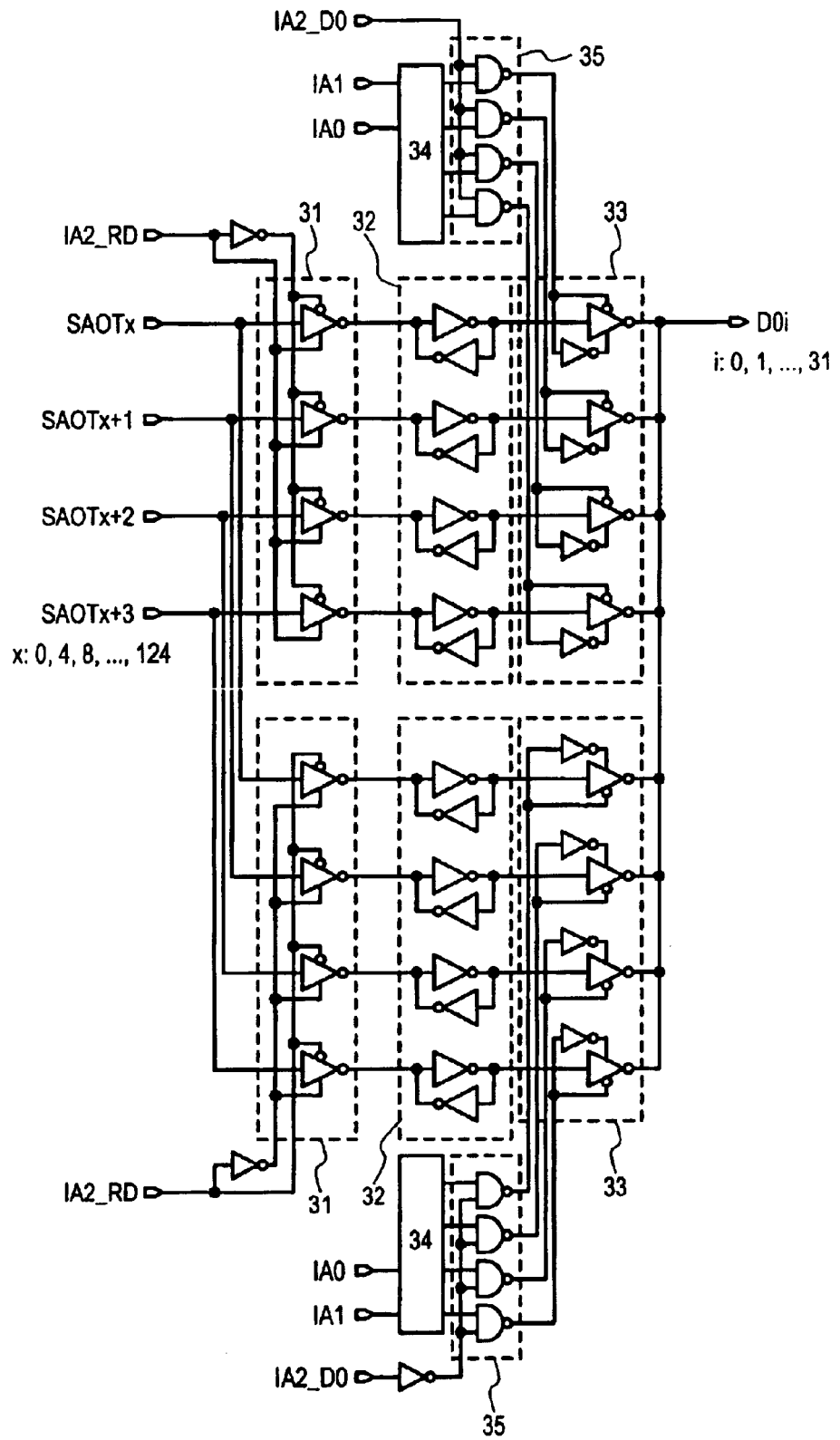
FIG. 4 is a circuit diagram showing a page buffer can be included in a semiconductor device like that of FIG. 1.
Figure 5:
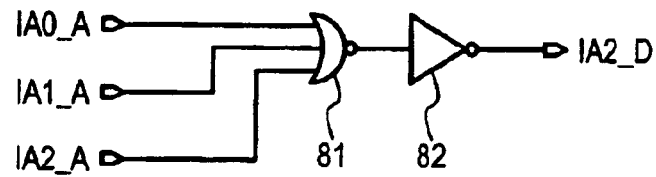
FIG. 5 is a circuit diagram showing a page read look-ahead judging circuit that can be included in a semiconductor device like that of FIG. 1.
Figure 6:
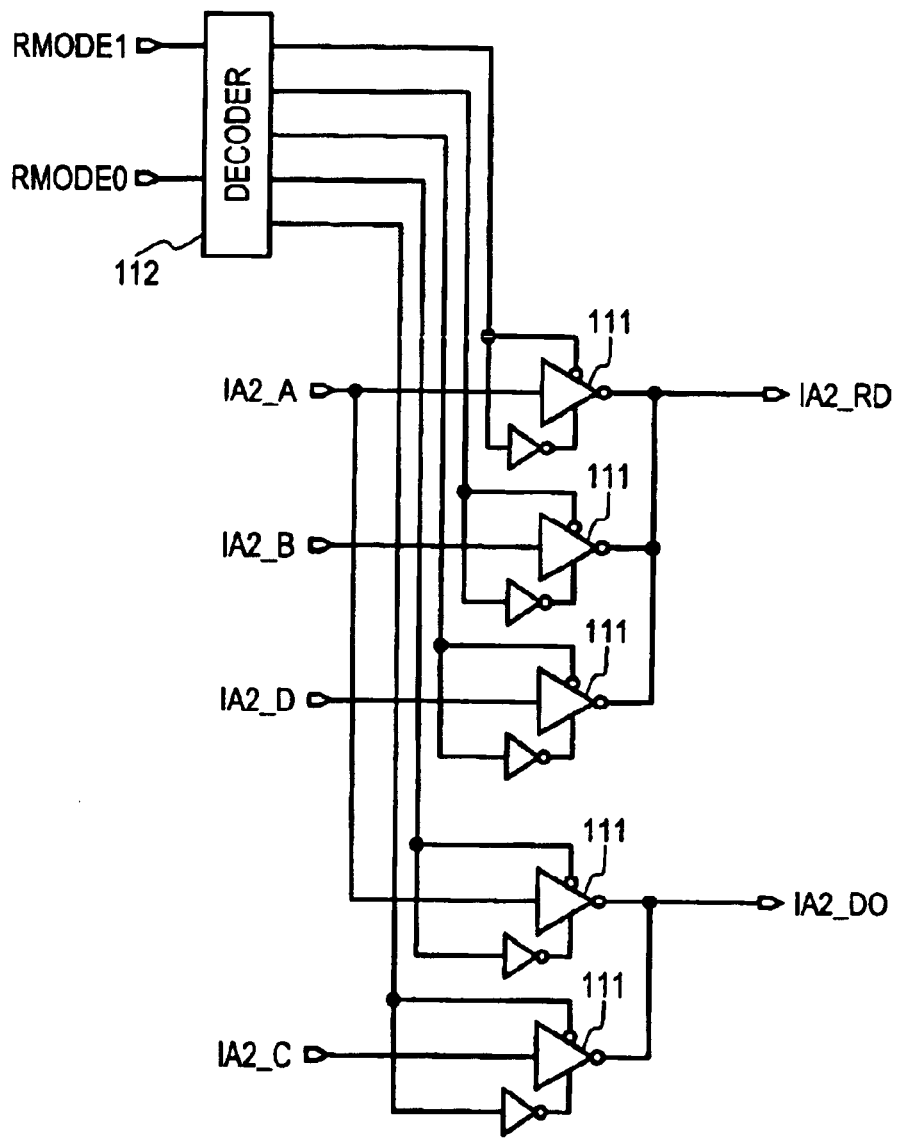
FIG. 6 is a circuit diagram showing an address selecting circuit that can be included in a semiconductor device like that of FIG. 1.
Figure 7:
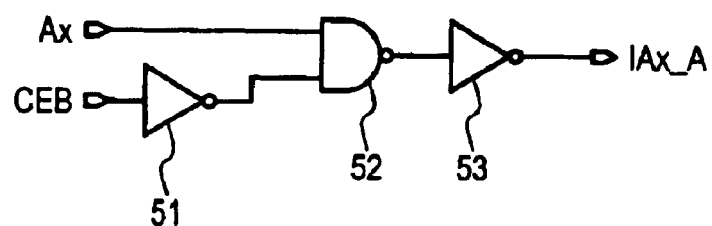
FIG. 7 is a circuit diagram showing an input buffer that can be included in a semiconductor device like that of FIG. 1.
Figure 8:
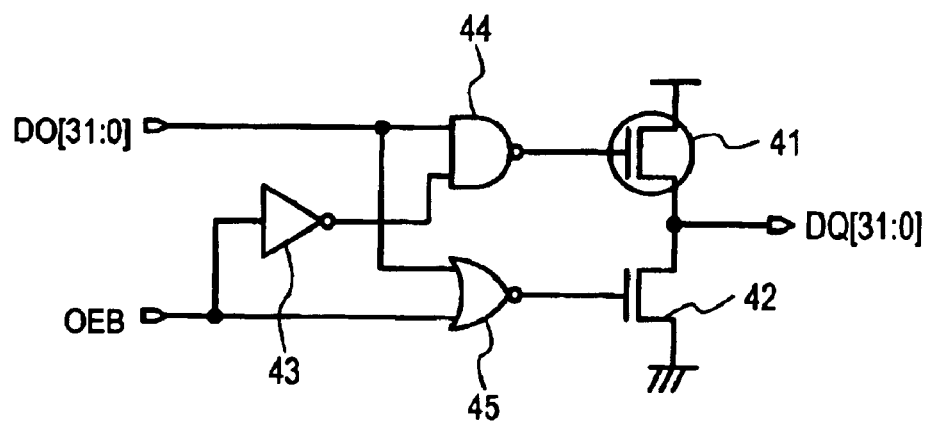
FIG. 8 is a circuit diagram showing an output buffer that can be included in a semiconductor device like that of FIG. 1.

FIG. 1 is a block diagram showing one example of a semiconductor memory device according to one embodiment of the present invention. FIG. 2 is a circuit diagram showing one example of a memory cell array like that shown in FIG. 1. FIG. 3 is a circuit diagram showing one example of a sense amplifier like that shown in FIG. 1. FIG. 4 is a circuit diagram showing one example of a page buffer like that shown in FIG. 1. FIG. 5 is a circuit diagram showing one example of a page read look-ahead judging circuit like that shown in FIG. 1. FIG. 6 is a circuit diagram showing one example of an address selecting circuit like that shown in FIG. 1. FIG. 7 is a circuit diagram showing one example of an input buffer like that shown in FIG. 1. FIG. 8 is a circuit diagram showing one example of an output buffer like that shown in FIG. 1.

As shown in FIG. 1, a semiconductor memory device according to one embodiment may include a memory cell array 1 in which data values can be stored, a sense amplifier 2 for reading data stored in memory cell array 1, a page buffer 3 for temporarily holding data read out from memory cell array 1, an output buffer 4 for outputting a read-out data to outside the semiconductor device, a number of input buffers for receiving address signals from outside the semiconductor device, a first addressing generating circuit 6, and a number of second address generating circuits 7.

A first address generating circuit 6 can correspond to a most significant bit of a page address, and can generate a control signal IA2_RD and IA2_D0. Data can be captured within a page buffer 3 according to control signal IA2_RD. Data can be output from a page buffer 3 in accordance with IA2_D0.

Second address generating circuits 7 can correspond to those bits of a page address other than a most significant bit (i.e., less significant page address bits), and can generate control signals IA1 and IA0. According to control signals IA1 and IA0, data can be output at a timing from a page buffer 3 that can depend upon whether the semiconductor memory device is operating in a page or burst mode.

A semiconductor memory device according to the present invention can be configured to read data for an entire page length or burst length from a memory cell array 1 two times, once for a first half of the data, and then again for a second half of the data. Thus, a number of sense amplifiers can be half a maximum page length or a maximum burst length. In addition, a page buffer 3 can be configured to store data for an entire page length or a burst length. This can allow data of a second half to be read out from a memory cell array 1 before all data of the first half is output from the semiconductor memory device.

Consequently, with a configuration according to the present invention, data for a maximum page length is not collectively read from a memory cell array 1, as in the prior art. Thus, the configuration of the present invention is limited to applications in which data is output in an order that starts with from one end of an address range (e.g., lower address) for both the page mode and a burst mode. But, in cases where a page length is specified to be half a maximum page length, data read out from a memory cell array 1 can be output in an arbitrary order, as in the conventional approach described above.

Figure 11:
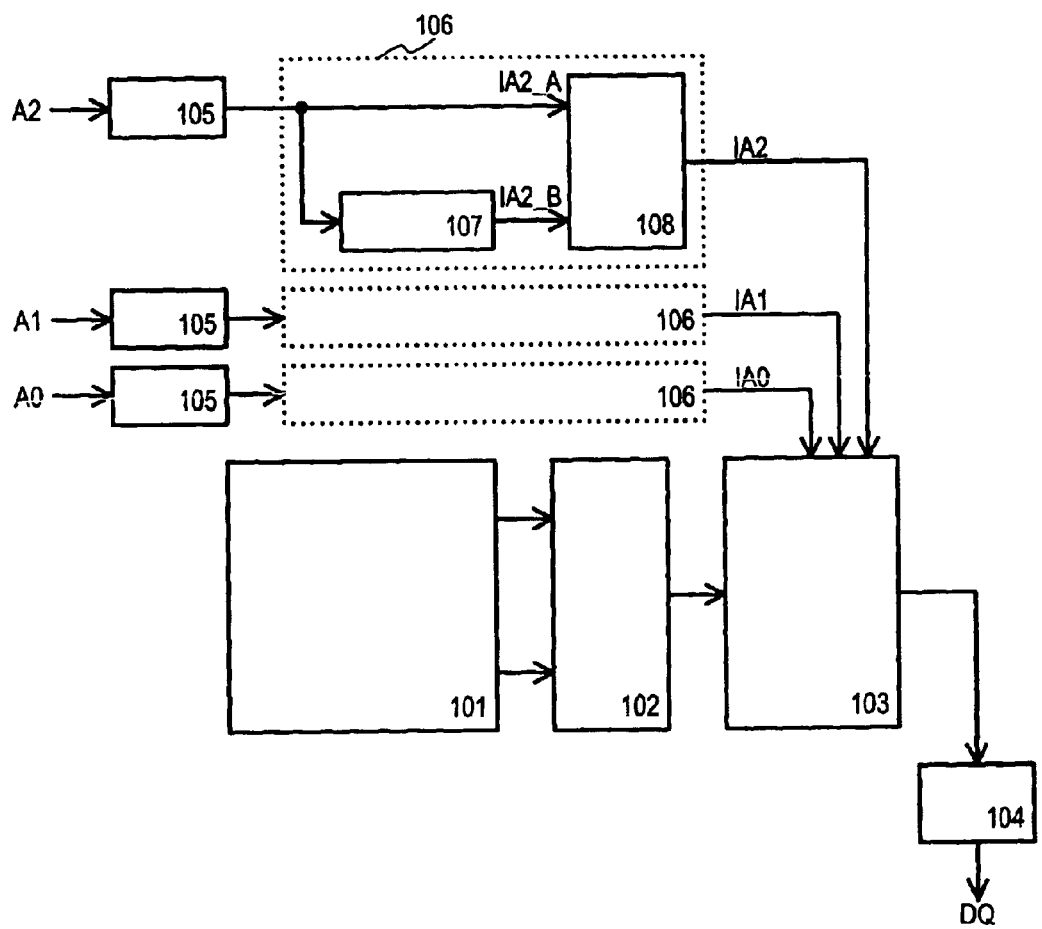
FIG. 11 is a block diagram showing a conventional semiconductor memory device.

It is noted that the particular semiconductor memory device shown in FIG. 1 is configured to read out data having a size of two words in units of eight data, at a maximum. This is similar to the conventional semiconductor memory device shown in FIG. 11 (the page length and burst length are both equal to eight).

In the particular embodiment of FIG. 1, a cell region corresponding to eight pages within a memory cell array 1 can be accessed according to normal addresses (A3 to A22). Further, a cell region corresponding to the four pages of a first half or second half of such eight pages can be selected according to a most significant bit (A2 in this example) of a page address. Particular data for a page length or burst length can be output from page buffer 3 according to the lower three bits (e.g., A0 to A2) of the address signal.

Referring still to FIG. 1, a first address generating circuit 6 can include a page read look-ahead judging circuit 8, a first burst address counter $9_1$, a second burst address counter 10, and a first address selecting circuit 11.

A page read look-ahead judging circuit 8 can generate an internal address signal IA2_D. This address value can determine whether data for a first half or data of a second half is read out from memory cell array 1 and captured in page buffer 3.

A first burst address counter $9_1$ can be incremented synchronously with a first clock PACLK, and can output a signal IA2_B. Signal IA2_B can correspond to a most significant bit among internal address signals IA2_B, IA1_B and IA0_B, which can equal the number of bits of a page address (e.g., A[2:0]).

A second burst address counter 10 can be incremented synchronously with a second clock ADCLK, having a different frequency than the first clock PACLK, and can output a signal IA2_C. Signal IA2_C can correspond to a least significant bit among the total bits of the normal address bits containing and the most significant bit of the page address (e.g., A[31:2]).

A first address selecting circuit 11 can select from among internal address signals IA2_A, equal to the most significant bit of a page address, and internal address signals IA2_B, IA2_C and IA2_D, to generate control signals IA2_RD and IA2_D0.

In addition, a semiconductor memory device according to FIG. 1 can also include second internal address generating circuits 7, each corresponding to address bits A1 and A0, respectively. A second address generating circuit 7 can include a third burst address counter $9_2$ and a second address selecting circuit 12.

A third burst address counters $9_2$ can be incremented synchronously with a first clock PACLK, and can output a signal IA1_B (or IA0_B) corresponding to page address bit, other than a most significant page address bit (i.e., a less significant page address bit).

A second address selecting circuit 12 can select from signals IA1_A and IA1_B (or IA0_A and IA0_B) to output control signal IA1 (or IA0). In particular, in a page mode, second address selecting circuit 12 can output internal address signal IA_A (or IA0_A), provided by an input buffer 5, as control signal IA1 (or IA0). In a burst mode, second address selecting circuit 12 can output internal address signal IA_B (or IA0_B), provided by a third burst address counters $9_2$, as control signal IA1 (or IA0).

It is noted that a first clock PACLK and a second clock ADCLK can be generated according to a burst control signal generating circuit (not shown). Such a circuit may generate first and second clocks (PACLK and ADCLK) according to a clock signal supplied from outside the semiconductor memory device.

It is also noted that FIG. 1 utilizes the signal convention for multiple bit values of "[x:y]", which occurs throughout the various figures. For example, output signal DQ[31:0] provided by output buffer 4, includes output bit values DQ0 to DQ31 (e.g., 32 bits).

Referring now to FIG. 2, a memory cell array (like that shown as item 1 in FIG. 1) can include a number of memory cells (one of which is shown as MC) arranged in a matrix. A memory cell array can include switching transistors Q1 and Q2. Switching transistors can be turned on and off according to control signal IA2_RD, which can correspond to a memory cell region selected according to a most significant page address bit (e.g., A2=1 or A2=0). Input terminals of switching transistors (Q1 and Q2) can be connected to bit lines of their respective cell regions (e.g., A2=1 or A2=0). Output terminals of switching transistors (Q1 and Q2) can be connected to a sense amplifier.

A memory cell MC can be composed of a cell transistor that includes a floating gate and a control gate. Such a memory cell MC can be configured to provide an adjustable threshold voltage according to the amount of electrons injected into a floating gate. Thus, when a predetermined read voltage is applied to the control gate of a memory cell, a resulting current can flow that corresponds to the threshold voltage. In this way, a stored date value (e.g., "0" or "1") can be determined.

It is noted that in FIG. 2, for the sake of simplicity of description, only limited portions of the cell regions A2=0 and A2=1 are shown. It is understood that in an actual memory cell array, the number of word lines can correspond to the number of word lines selectable by decoding address signals Ax (x=0–22). Further the number of bit lines can correspond to the number of bit lines selectable according to a column address. A memory cell MC can be situated at an intersection of each bit line and word line.

Referring now to FIG. 3, a sense amplifier (like that shown as item 2 in FIG. 1), can include a memory cell amplifier 21, a reference cell RC, a reference cell amplifier 22, and a differential circuit 23. A memory cell amplifier 21 supplies a selected memory cell MC with a current Im, which can vary according to the data stored within the memory cell MC (e.g., according to cell threshold voltage).

A reference cell amplifier 22 can supply a current Im' to a reference cell RC. A reference cell RC can be a cell transistor having the same general structure as memory cell MC, and can be used to determine the data value stored in memory cell MC (e.g., "0" or "1"). The threshold voltage of reference cell RC can be set previously to a threshold voltage appropriate to distinguishing a data value stored in a memory cell MC.

A differential circuit 23 can compare an output voltage from a memory cell amplifier 21 to that of a reference cell amplifier 22, to thereby determine a data value stored in a memory cell MC.

Referring now to FIG. 4, a page buffer (like that shown as item 3 in FIG. 1) can include two sets of input circuits 31, two sets of holding circuits 32, two sets of output circuits 33, two decoders 34, and two sets of gate circuits 35.

Each set of input circuits 31 can include four 3-state gates for receiving data of four pages read out from sense amplifiers 2. Such data can be output at a predetermined timing.

Each set of holding circuits 32 can include four sets of cross-coupled inverters for storing an output value from an associated input circuit of an input circuit set 31.

Each set of output circuits 33 can include four 3-state gates for receiving output data from an associated set of holding circuits 32. Such data can be output at a predetermined timing.

Each decoder 34 can decode control signals IA0 and IA1 output from second address selecting circuits 12. Each set of gate circuits 35 can include four NAND gates for outputting the output of an associated decoder 34 in accordance with control signal IA2_DO provided by a first address selecting circuit 11.

It is noted that sets of input circuits 31 can output data for four pages, corresponding to a first half of read data, when a control signal IA2_RD, from a first address selecting circuit 11, is at a logic "0" level. Similarly, data for another four pages, corresponding to a second half of read data, can be output when a control signal IA2_RD is at a logic "1" level.

In addition, sets of output circuits 33 can output data for four pages, corresponding to a first half of read data, when a control signal IA2_DO, from a first address selecting circuit 11, is at a logic "0" level. Similarly, data for another four pages, corresponding to a second half of read data, can be output when a control signal IA2_D0 is at a logic "1" level. At this time, the particular order of outputting data from an output circuit set 31 can be controlled in accordance with output signals from an associated decoder 34.

It is further noted that the particular configuration illustrated in FIG. 4 only shows an arrangement for one bit of output data. Thus, an actual semiconductor memory device can include a number of circuits like that shown in FIG. 4 corresponding to each bit of output data (such a number would be 32 in the example of FIG. 1).

Referring now to FIG. 5, a page read look-ahead judging circuit (like that shown as item 8 in FIG. 1) can include a NOR circuit 81 for outputting the negative OR of internal address signals IA2_A, IA1_A, and IA0_A, and an inverter 82 for inverting the output signal from NOR gate 81. In this way control signal IA2_D can be generated.

The page read look-ahead judging circuit shown in FIG. 5 is configured to change internal address signal IA2_D from a "0" to "1" when a page address changes from a "000" to "001". However, a page read look-ahead judging circuit need not be limited to such a configuration. A page read look-ahead judging circuit may be adapted to any configuration, provided such a circuit is capable of changing the level of an internal address signal IA2_D from "0" to "1" before the reading out of a first half of data by sense amplifiers 2 is completed, and before a most significant bit (A2) of a page address is changed from "0" over to "1", by an amount of time required for reading out a second half of data.

Referring now to FIG. 6, a first address selecting circuit (like that shown as item 11 in FIG. 1) can include a number of 3-state gates 111 for receiving internal address signals IA2_A, IA2_B, IA2_C, and IA2_D, and a decoder 112 for decoding read-out mode signals RMODE0 and RMODE1, and thus controlling the output of signals from the 3-state gates 111. Read-out mode signals RMODE0 and RMODE1 can be supplied from a mode controlling circuit (not shown).

Referring still to FIG. 6, a control signal IA2_RD can be generated according to an output from the 3-state gates 111 receiving internal address signals IA2_A, IA2_B, and IA2_D. In addition, control signal IA2_D0 can be generated according to an output from the 3-state gates 111 receiving internal address signals IA2_A and IA2_C.

It is noted that, in a similar fashion to the first address selecting circuit shown in FIG. 6, a second address selecting circuit (like that shown as item 12 in FIG. 1) can include 3-state gates 111 for receiving internal address signals IA1_A and IA1_B (or IA0A and IA0_B), and a decoder for decoding read mode signals RMODE0 and RMODE1. This decoding can control which signal is output from such 3-state gates 111. In such a configuration, internal address signals IA1_A and IA0_A from input buffers 5 can be output as control signals IA1 and IA0, respectively, in a page mode, and internal address signals IA1_B and IA0_B from third burst address counters $9_2$ can be output as control signals IA1 and IA0, respectively, in a burst mode.

Referring now to FIG. 7, an input buffer (like that shown as item 5 in FIG. 1) can include an inverter 51, a NAND gate 52, and an inverter 53. Inverter 51 can invert a chip enable signal CEB to provide one input to NAND gate 52. Another input to NAND gate 52 can be an address signal Ax (x=0, 1, 2 . . . ). NAND gate 52 can output a negative AND of its respective input signals. This output can be inverted by inverter 53. In such a configuration, when a chip enable signal CEB is at a level "0", and address signal Ax can be output from the input buffer and captured within a semiconductor memory device.

Referring now to FIG. 8, an output buffer (like that shown as item 4 in FIG. 1) can include a p-channel transistor 41, an n-channel transistor 42, an inverter 43, a NAND gate 44, and a NOR gate 45. Inverter 43 can invert an output enable signal OEB to provide one input to NAND gate 44. NAND gate 44 can have another input that receives input signal DO[31:0], and can output the negative AND of its respective inputs. NOR gate 45 can receive an input signal DO[31:0] and output enable signal OEB as inputs, and can output the negative OR of its respective inputs. The p-channel transistor 41 can have gate connected to the output of NAND gate 44 and a source-drain path coupled between a high supply level and a data output. The p-channel transistor 41 can be for driving an output data signal DQ to a logic "1". The n-channel transistor 42 can have a gate connected to the output of NOR gate 45, and a source-drain path coupled between a low supply level and the data output. The n-channel transistor 42 can be for driving an output data signal DQ to a logic "0".

It is understood that FIG. 8 shows an output buffer for one bit, and such a circuit can be repeated to correspond to the number of output bits (which is 32 in the example of FIG. 1). In such an arrangement, when output enable signal OEB is at a level "0", output data signals (e.g., DQ[31:0]) are sent which correspond to input signals (e.g., DO[31:0]).

Next, an operation of the semiconductor memory device according to the embodiment of FIG. 1 will be described with reference to the drawings.

Figure 9:
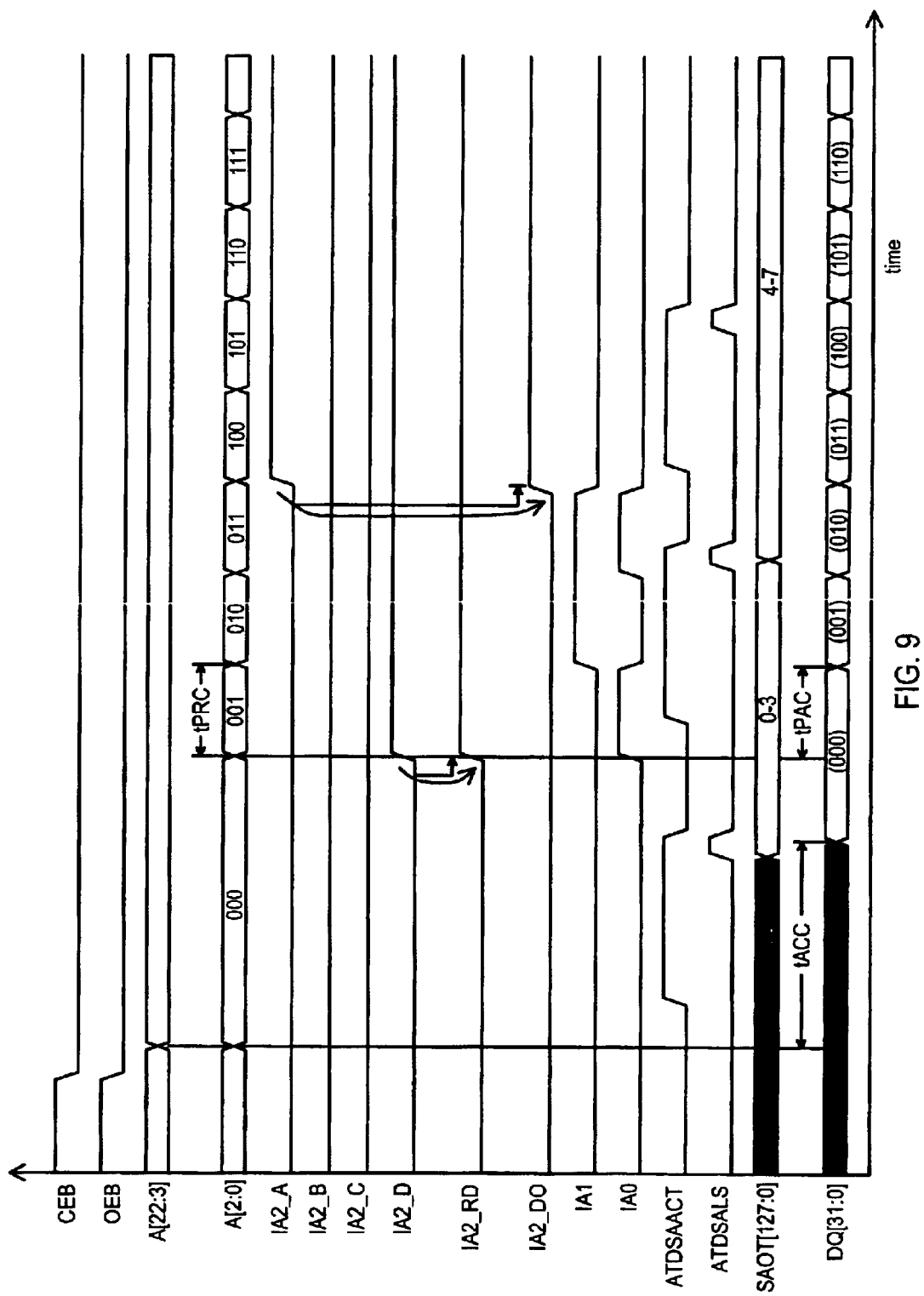
FIG. 9 is a timing diagram showing a data read operation in a page mode for a semiconductor memory device according an embodiment.
Figure 10:
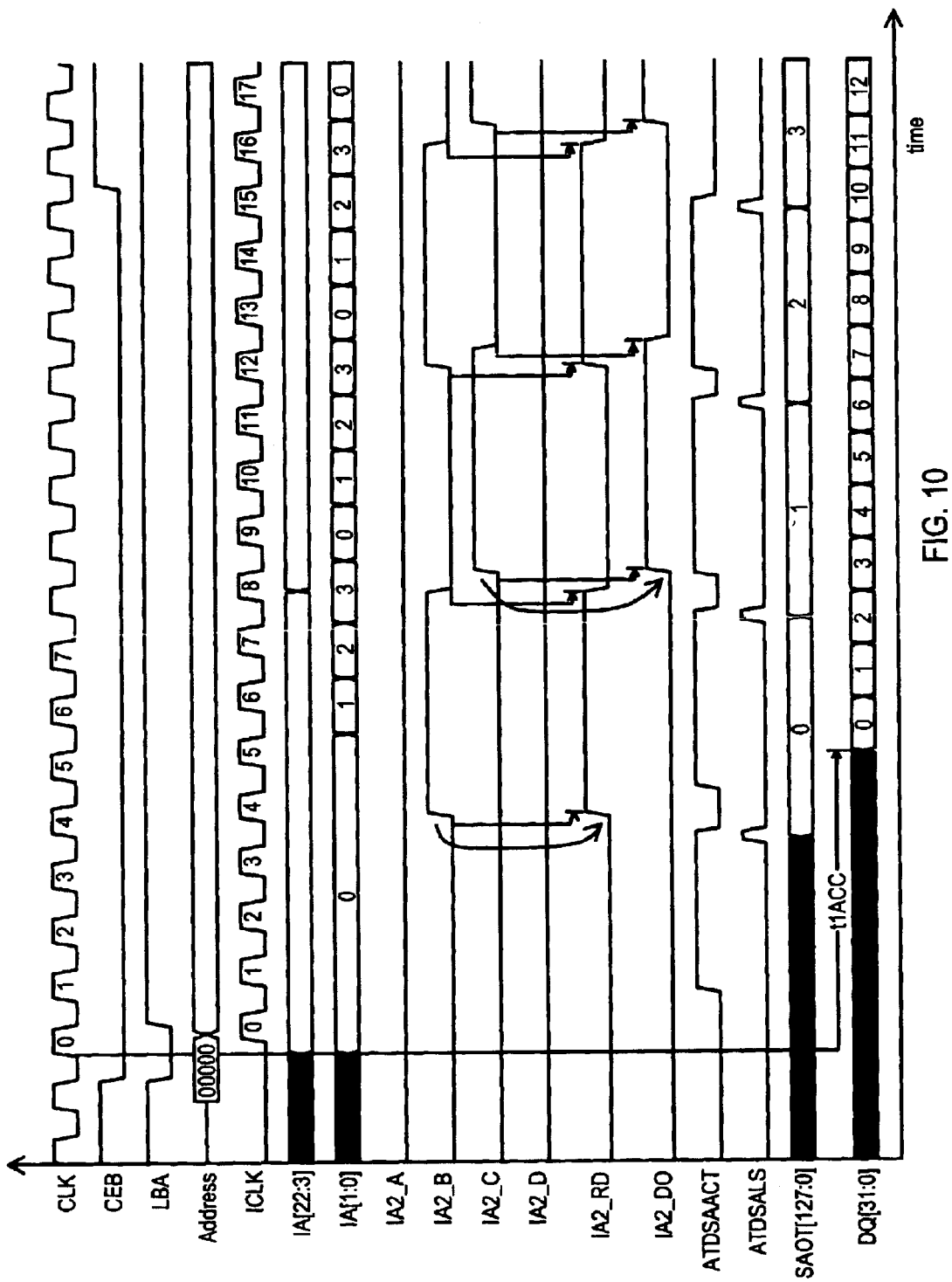
FIG. 10 is a timing diagram showing a data read operation in a burst mode for a semiconductor memory device according an embodiment.

FIG. 9 is a timing chart showing an operation for the reading out of data in a page mode for an embodiment like that shown in FIG. 1. FIG. 10 is a timing chart showing an operation for the reading out of data in a burst mode for an embodiment like that shown in FIG. 1.

First, an operation showing the read out of data in the page mode, according to one embodiment, will be described. Note, that in the following description, it is assumed that the semiconductor memory device has been previously set to a page read mode with a page length=8, according to predetermined control signals.

At the time when the semiconductor memory device is set in the page read mode, as shown in FIG. 9, a chip enable signal CEB and output enable signal can be set to a logic "0", a predetermined cell region has be selected according to a normal address A[22:3], and a page address A[2:0] has been set to "000". Also at this time, the level of an activation signal ATDSAACT, used to activate sense amplifiers 2, can transition from a logic "0" to a logic "1". Still further, at this time the page address A[2:0] can held at "000" for time equal to or greater than a time shows as tACC.

Subsequently, the level of an output control signal ATDSALS, which can determine when data will be output from sense amplifiers 2, can transition from a logic "0" to a logic "1". In accordance with such a transition, data SAOT [127:0], which can correspond to four pages, can be output from sense amplifiers 2. At this time, because control signal IA2_RD, output from first address selecting circuit 11 is at a level of "0", a cell region corresponding to A2=0 can be selected by operation of switching transistors Q1 and Q2. Thus, data for four pages corresponding to a first half of data from a region A2=0, can be output from sense amplifiers 2 and captured in a first half of page buffer 3.

In addition, at this time, because a control signal IA2_D0 output from a first address selecting circuit 11 is at a logic "0" level, data of a first half, captured by page buffer 3, can be output in the order of page addresses A[2:0] supplied from outside the semiconductor memory device. Such data may be output at a time period (tPAC), by way of output buffer 4.

Referring still to FIG. 9, when a page address A[2:0] changes over from "000" to "001" while data corresponding to a first half is being output, the level of internal address signal IA2_D, output from page read look-ahead judging circuit 8, can change from a logic "0" to a logic "1". Further, control signal IA2_RD output from first address selecting circuit 11 can change from a logic "0" to a logic "1".

Subsequently, the activation signal ATDSAACT for sense amplifiers 2 transitions from a logic "0" to a logic "1" once again, and control signal ATDSALS transitions from a logic "0" to a logic "1" once again. As a result, data SAOT[127:0] for four pages can be output from sense amplifiers 2 again. At this time, because the control signal IA2_RD output from first address selecting circuit 11 is at a logic level "1", a cell region A2=1 has been selected by switching transistors Q1 and Q2. Thus, data for four pages corresponding to a second half of data from a region A2=1, can be output from sense amplifiers 2 and captured in a second half of page buffer 3.

Subsequently, at the time when the page address A[2:0] has changed from "011" to "100", internal address signal IA2_A changes from a logic "0" to a logic "1", and control signal IA2_D0 output from first address selecting circuit 11 can change from a logic "0" to a logic "1".

When the level of control signal IA2_D0 transitions from a logic "0" to a logic "1", data for pages of a second half captured within page buffer 3, can be output in the order of page addresses A[2:0] supplied from outside the semiconductor memory device. Such data may be output periodically, at a time period (tPAC), by way of output buffer 4.

Next, an operation showing the read out of data in the burst mode, according to one embodiment, will be described. Note, that in the following description, it is assumed that the semiconductor memory device has been previously set to a burst read mode with a burst length=8, according to predetermined control signals.

At the time when the semiconductor memory device is set in the burst read mode, as shown in FIG. 10, a chip enable signal CEB and output enable signal (not shown) can be set to a logic "0". A predetermined cell region has been selected according to a normal address A[22:3]. Also, similar to the page mode operation described above, the level of an activation signal ATDSAACT used to activate sense amplifiers 2 can transition from a logic "0" to a logic "1".

Subsequently, the level of an output control signal ATDSALS can transition from a logic "0" to a logic "1". In accordance with such a transition, data SAOT[127:0] for four pages can be output from sense amplifiers 2. At this time, because control signal IA2_RD, output from first address selecting circuit 11 is at a level of "0", a cell region corresponding to A2=0 can be selected by operation of switching transistors Q1 and Q2. Thus, data for four pages, corresponding to a first half of data from a region A2=0, can be output from sense amplifiers 2 and captured in a first half of page buffer 3.

In addition, at this time, because a control signal IA2_D0 output from a first address selecting circuit 11 is at a logic "0" level, after a lapse of a time period t1ACC, corresponding to a latency number set in accordance with an external command, data of the first half captured in page buffer 3 can be output. Such data can be output in an order, starting with a lower address, and synchronously with a count output from third burst address counter 9$_2$. Such data may be output by way of output buffer 4.

Referring still to FIG. 10, after data for pages of a first half are captured in page buffer 3, counting operations of a first burst address counter 9$_1$ and second burst address counter 9$_2$ can progress. When the level of internal address signal IA2_B, output from first burst address counter 9$_1$ changes from a logic "0" to a logic "1", control signal IA2_RD output from first address selecting circuit 11 can change from a logic "0" to a logic "1".

Subsequently, the activation signal ATDSAACT for sense amplifiers 2 transitions from a logic "0" to a logic "1" once again, and control signal ATDSALS transitions from a logic "0" to a logic "1" once again. As a result, data SAOT[127:0] for four pages can be output from sense amplifiers 2 again. At this time, because the control signal IA2_RD output from first address selecting circuit 11 is at a logic level "1", a cell region A2=1 has been selected by switching transistors Q1 and Q2. Thus, data for four pages corresponding to a second half of data from a region A2=1, can be output from sense amplifiers 2 and captured in a second half of page buffer 3.

Subsequently, the counting operation of a second burst address counter 10 progresses so that a level of internal address signal IA2_C changes from a logic level "0" to a logic level "1", and control signal IA2_D0 output from first address selecting circuit 11 can change from a logic "0" to a logic "1".

When the level of control signal IA2_D0 transitions from a logic "0" to a logic "1", data for pages captured for a second half within page buffer 3, can be output in an order, starting with a lower address, and synchronously with a count output from third burst address counter 9$_2$. Such data may be output by way of output buffer 4.

As has been set forth above, in a semiconductor memory device according to the present invention, data for a total page length or total burst length can be read from a memory cell array in two parts: a first half and a second half. Data for a total page length and buffer length can be read out and stored in a page buffer. Thus, it can be possible to read out data in pages or burst with a number of sense amplifiers that is half the total page length or burst length. This is in contrast to conventional approaches having a 1:1 relationship between total page/burst length and number of sense amplifiers.

In this way, by reducing a number of sense amplifiers by one half, the present invention can provide page reads and burst reads without the increase in chip size and/or power consumption present in conventional approaches.

From the above description, it can be understood that a semiconductor memory device according to the present invention can have the advantageous effects. A semiconductor memory device according the present invention can include sense amplifiers for reading out data for a page length of burst length from a memory cell array in two portions, including a first half and a second half. A page buffer can temporarily store data for the page length or burst length read out from the memory cell array by the sense amplifiers. The operation for reading out data in pages or bursts is realized with a number of sense amplifiers that is half the page length or burst length. Consequently, the number of sense amplifiers can be reduced to half that of conventional approaches, and thus it can be possible to suppress chip size and power consumption.

It is understood that while the various embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a plurality of sense amplifiers that reads out data from a memory cell array at least twice to access a first portion of the read data and a second portion of the read data for a page mode access or burst mode access;
   a page buffer for storing the first portion and second portion of the read data for subsequent output from the page buffer; and
   the amount of data bits of the first portion and second portion combined is one of the group consisting of: a maximum page length accessible by the semiconductor memory device and a maximum burst length accessible by the semiconductor memory device.

2. The semiconductor memory device of claim 1, further including:
   a page base address comprising multiple bits of an address selects data for the page mode access or burst mode access;
   a first address generating circuit coupled to a most significant bit of the page address that generates a first control signal for selecting which of the first portion or second portion is captured in the page buffer and a second control signal for selecting which of the captured first portion or second portion is output from the page buffer; and
   a plurality of second address generating circuits coupled to less significant bits of the page address that each generate a third control signal for controlling the timing at which data is output from the page buffer.

3. The semiconductor memory device of claim 2, wherein:
   each second address generating circuit includes
      a third burst address counter incremented according to the first clock, that outputs a less significant bit of the second internal address signal; and
      a second address selecting circuit that, in a burst mode generates a third control signal from the output of the third burst address counter, and in a page mode generates the third control signal from a less significant bit of the page address.

4. The semiconductor memory device of claim 2, wherein:
   the first address generating circuit includes
      a page read look-ahead judging circuit that generates a first internal address signal for accessing the first portion or second portion;
      a first burst address counter incremented according to a first clock of a first predetermined period, that outputs a most significant bit of a second internal address signal corresponding to the bits of the page address; and
      a first address selecting circuit that selects from among at least an output of the page read look-ahead judging circuit and an output of the first burst address counter in response to a mode value, to thereby generate the first control signal.

5. The semiconductor memory device of claim 4, wherein:
   the first address generating circuit further includes
      a second burst address counter incremented according to a second clock having a different period than the first clock, that outputs a least significant bit of a third internal address signal that corresponds to an ordinary address and the most significant page address bit; and
      the first address selecting circuit selects from among the output of the second burst address counter and a fourth address signal in response to the mode value to thereby generate the second control signal, the fourth address signal corresponding the most significant bit of the page address.

6. The semiconductor memory device of claim 4, wherein:
   the page read look-ahead judging circuit changes the logic level of the first internal address signal from a first logic value to a second logic value prior to data from the first portion being output from the semiconductor memory device; and
   data from the second portion is read out by the sense amplifiers by the time the most significant bit of a page address transitions from a logic "0" to a logic "1".

7. The semiconductor memory device of claim 4, wherein:
   the page read look-ahead judging circuit changes the logic level of the first internal address signal in response to the page address bit values transitioning from all being at one logic value to at least one being at a different logic value than the one logic value.

8. A semiconductor memory device, comprising:
   a sense amplifier set having M sense amplifiers;
   a memory cell array that couples at least two different portions of the memory cell array to the sense amplifier set in different access operations in response to a first control signal;
   a page buffer that stores N data bits from each of the different access operations, where N is greater than M, for output in groups of Q, where Q is less than M and greater than 1; and
   the memory cell array comprises nonvolatile memory cells and couples the at least two different portions of the memory cell array to the sense amplifier set in different access operations in both a pane mode and burst mode.

9. The semiconductor memory device of claim 8, wherein:
   the number of sense amplifiers M is half the number of page buffer data bits N.

10. The semiconductor memory device of claim 8, further including:

a first address generating circuit includes a page read look-ahead circuit that provides an output signal in response to a most significant bit of a page address to access a first portion of the memory cell array, and then alters the first control signal in response to a predetermined change in the page mode address to access a second portion of the memory cell array.

11. The semiconductor memory device of claim 10, further including:

the first address generating circuit further includes
a burst address counter that provides an output value that is incremented in response to a first clock, and
a first address selecting circuit that selects from among an output of the page read look-ahead circuit and an output of the burst address counter in response to mode information.

12. A semiconductor memory device, comprising:

a page buffer for storing data values for output in a page mode and burst mode; and a set of sense amplifiers that reads out data values to the page buffer for one page mode access or one burst mode access in at least two different operations that access different portions of a memory cell array.

13. The semiconductor memory device of claim 12, wherein:

the page buffer includes
a first output circuit coupled between a first holding circuit and a data output that is enabled by an output control signal having a first value, and
a second output circuit coupled between a second holding circuit and the data output that is enabled by the output control signal having a second value.

14. The semiconductor memory device of claim 13, further including:

a first address generating circuit that generates the output control signal in response to a most significant page address bit value in a page mode, and generates the output control signal in response to a burst address counter in a burst mode.

15. The semiconductor memory device of claim 12, further including:

a first portion of the data values is stored at lower page addresses and a second portion of the data values are stored at higher page addresses; and a page read look-ahead circuit that sets an address signal for accessing the first portion of the data values in a first read operation, and sets the address signal for accessing the second portion of the data values in response to a lower page address.

16. The semiconductor memory device of claim 15, wherein:

the page read look-ahead circuit sets the address signal for accessing the second portion of the data values in response to bits of a page address changing from being the same value to at least one of the bits being a different from the other page address bits.

17. The semiconductor memory device of claim 12, wherein:

the set of sense amplifiers reads out a first portion of the data values to the page buffer in a first operation, and reads out a second portion of the data values to the page buffer in a second operation before the first portion data values are output from the page buffer.

18. The semiconductor memory device of claim 12, further including:

a first address generating circuit that, in a page mode, generates an output control signal that accesses different portions of the page buffer in response to a most significant bit of a page address, and in a burst mode accesses the different portions of the page buffer in response to a burst address counter.

* * * * *